Figure 1:
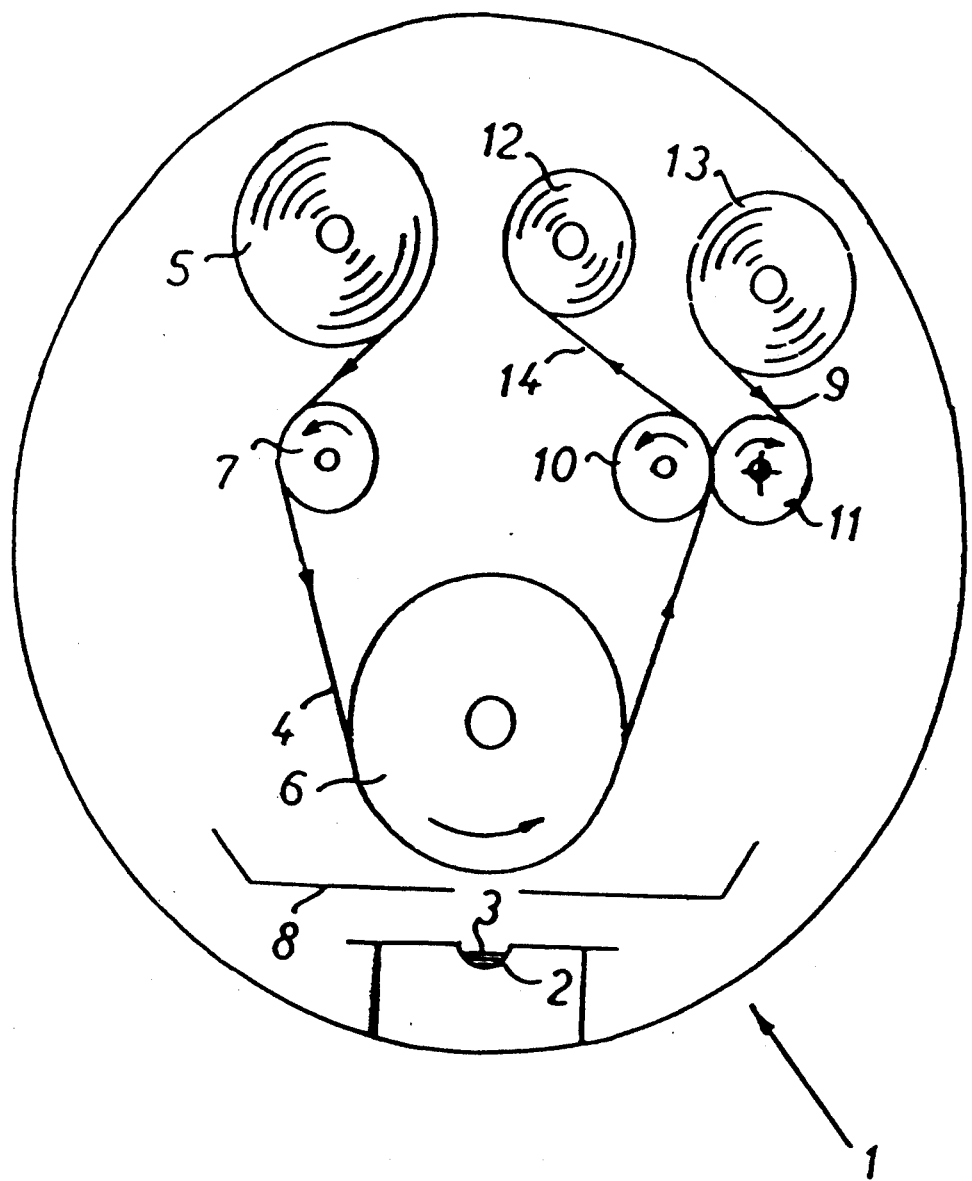

United States Patent [19]
Leenders et al.

[11] Patent Number: 5,147,490
[45] Date of Patent: Sep. 15, 1992

[54] PROCESS FOR THE PRODUCTION OF A HEAT-MODE RECORDING MATERIAL

[75] Inventors: Luc H. Leenders, Herentals; Luciaan F. Voet, St. Katelijne-Waver; Dirk M. D'hont, Mortsel, all of Belgium

[73] Assignee: AGFA-Gevaert N.V., Mortsel, Belgium

[21] Appl. No.: 480,603

[22] Filed: Feb. 15, 1990

[30] Foreign Application Priority Data

Feb. 24, 1989 [EP] European Pat. Off. ............ 89200466

[51] Int. Cl.$^5$ .......................... B44C 1/00; C23C 14/00
[52] U.S. Cl. ................................... 156/238; 156/239; 156/249; 156/324; 156/382; 118/718; 427/251
[58] Field of Search .............. 156/382, 151, 150, 249, 156/324, 238, 239; 118/718; 427/251, 255.5

[56] References Cited

U.S. PATENT DOCUMENTS

| | | | |
|---|---|---|---|
| 3,279,966 | 10/1966 | Calvert | 156/249 X |
| 3,329,549 | 7/1967 | Vilutis | 156/382 X |
| 3,767,500 | 10/1973 | Tally | 156/324 X |
| 3,837,952 | 9/1974 | Mogford | 156/249 X |
| 4,267,261 | 5/1981 | Hallman et al. | 427/56.1 X |
| 4,422,159 | 12/1983 | Craighead et al. | 346/135.1 X |
| 4,818,852 | 4/1989 | Haddock et al. | 235/488 |

OTHER PUBLICATIONS

Park, W. R. R., *Plastics Film Technology*, Van Nostrand Reinhold Company, 1969, pp. 192–197.
Shields, J., *Adhesives Handbook*, CRC Press: 1970, pp. 28–32.

*Primary Examiner*—David A. Simmons
*Assistant Examiner*—Chester T. Barry
*Attorney, Agent, or Firm*—William J. Daniel

[57] ABSTRACT

A process for the production of a heat-mode recording material by coating in a sealed zone maintained under vacuum conditions a web support with a heat-mode recording layer of vapor depositable material and within the sealed zone laminating a protective organic resin layer in web form by means of an adhesive layer onto the supported heat-mode recording layer. The web support moves within the sealed zone from a delivery reel to a take-up roll with the recording layer deposited thereon in a region between the rolls and the protective layer is laminated over the recording layer before the coated web support is collected on the take-up rolls.

15 Claims, 3 Drawing Sheets

PROCESS FOR THE PRODUCTION OF A HEAT-MODE RECORDING MATERIAL

DESCRIPTION

The present invention relates to a process for the production of a heat-mode recording material having "direct read after write" (DRAW) possibilities.

Almost all of the known DRAW recording materials are characterized by a heat mode recording layer, i.e. a layer wherein the recording proceeds by absorption of light causing an intense heating which results in a human readable or machine readable mark.

In common heat-mode DRAW recording materials a thin recording layer of relatively low melting metals, their alloys or dyes is present on a support. Such layers are strictly not light-sensitive but are responsive to the thermal energy set free by the absorption of a high-intensity, short duration pulse of laser light. The writing spot ablates or melts a small amount of the thermo-sensitive layer which in the heated area by surface tension contracts and shows a small cavitation or hole.

DRAW recording materials can be used as a medium for recording an imagewise modulated laser beam to produce a human readable or machine readable record.

Human readable records are e.g. micro-images that can be read on enlargement and projection. An example thereof is computer output microfilm (COM) on a transparent support. Computer output microfilm images can be read by optical enlargement in a reader on projecting light through the COM record. The enlarged microfilm image can be copied on a suitable recording element such as diazo film or a silver halide emulsion material. Hard copies of the enlarged images can be obtained in a reader-printer by techniques known e.g. from the electrophotographic art.

An example of a machine readable DRAW recording material is the optical disk. To date for the production of optical disks tellurium and tellurium alloys have been used most widely to form highly reflective thin metal films wherein heating with laser beam locally reduces reflectivity by pit formation (ref. e.g. the periodical Physik in unserer Zeit, 15. Jahrg. 1984/Nr. 5, 129-130 the article "Optische Datenspeicher" by Jochen Fricke). Tellurium is toxic and has poor archival properties because of its sensitivity to oxygen and humidity. Therefore, the recording layers containing tellurium are airtightly protected to achieve an acceptable archival life.

To avoid the toxicity problem other relatively low melting metals such as Sn and Bi have been introduced in the production of a heat-mode recording layer. A survey of other metals also suited for use in DRAW heat-mode recording is given in U.S. Pat. Nos. 4,499,178 and 4,388,400.

Metal layers have a relatively high reflectivity so that by their ablation in heat-mode recording spots of lower reflectivity are obtained.

According to another embodiment an increase in transmission is obtained in laser beam heated areas by using an initially poor reflective heat-mode recording layer on a transparent support which layer becomes ablated in the laser beam struck areas. Such layer intended for COM-production and being made of co-deposited low melting point metals and sulphides such as GeS or SnS on a transparent support is described e.g. in Journal of Applied Photographic Engineering, Vol. 9, No. 1, Feb. 1983, p. 12. For the production of optical disks wherein the information is read in the reflection mode said poor reflective heat-mode recording layer is applied onto a relatively high melting reflective support or layer, e.g. aluminium or graphite layer, carried by a support.

In a further embodiment heat-mode recording is carried out with binderless organic dye layers as described e.g. in the periodical Philips Techn. T. 41, p. 338-346 by D. J. Gravesteijn and J. van der Veen.

Thin (normally less than 0.1 micron thick) layers of metals, alloys or dyes suited for heat-mode recording are produced advantageously by vacuum-deposition. These thin vacuum-deposited layers are mechanically weak and require the application of a protective coating.

The protective coating having a mechanical function in protecting the recording layer against direct abrasive contact with other materials has in optical disks also an optical function in that it keeps possible dirt out of focus in the optical playback of the information.

The protection of the mechanically vulnerable recording layer has been done by two approaches. In a first approach two recording layers on separate supports are assembled into a sandwich, with their supports facing out and having in between a space which can be filled with a chemically inert gas. In a second approach the recording surface is coated with a transparent material acting as protective overcoat (see IEEE Spectrum August 1978, pages 22 and 23 and particularly FIG. 2A and 2B).

According to U.S. Pat. Nos. 4,499,178 and 4,388,400 for obtaining a heat-mode recording material having increased sensitivity, durability and mechanical strength it is effective to use organic resins in the production of a protective layer. Various resins can be used to form a protective layer, such as styrene resins, vinyl acetate resins, methacrylic acid ester resins, amide resins, cellulosic resins, halogenated polyolefins, phenolic resins, soluble polyesters, etc.

These resins are dissolved in a wide variety of solvents and spread by any known method onto the recording layer, whereupon the solvent is evaporated. The thickness of the protective layer varies with the film strength, resistance to time-dependent change and required recording density. Normally the thickness is in the range of 0.01 to 5 $\mu$m (micron).

The coating or spraying of a protective layer from a dissolved resin does not proceed inside the vacuum chamber used for the vacuum deposition of the heat-mode recording layer. After a web-type support has been vacuum-coated with the heat-mode recording layer it is wound on a take-up roller in the vacuum chamber, whereupon it is taken therefrom to the coating station in atmospheric conditions for unwinding and coating of the web with dissolved resin or resin mixture.

It has been established experimentally by us that the winding and unwinding of a web having a freshly vacuum-coated heat-mode recording layer gives rise to the production of optical defects such as pin-holes in the recording layer since sliding friction unavoidable in said operation causes damages to the recording layer by abrasion and dust formation even when the winding and unwinding operations are kept under control. Pin-holes and all kinds of micro-scratches are particularly undesirable in recording materials for producing micro-images.

It is one of the objects of the present invention to provide a process for the production of a heat-mode recording material having "direct read after write" (DRAW) possibilities which process results in a substantial decrease in optical defects such as pin-holes in a vacuum-coated heat-mode recording layer.

Other objects and advantages of the present invention will appear from the further description and drawings.

According to the present invention a process for the production of a heat-mode recording material having "direct read after write" (DRAW) possibilities is provided wherein in said process a web support is coated under vacuum conditions with a heat-mode recording layer, characterized in that in the same vacuum environment as wherein said coating takes place a protective organic resin layer in web form is laminated to said supported recording layer by means of an adhesive layer.

Vacuum-coating proceeds according to one embodiment by "vacuum evaporation" which aptly applies to a process involving the vaporization of bulk material and redeposition thereof as a thin layer on a substrate under substantially reduced pressure.

Vacuum-coating proceeds according to another embodiment by "sputtering". Sputtering involves the production of energetic particles by ionization of a gas (usually argon at reduced pressure) and the bombardement with said particles of the target material in an electric field whereby the ejection of target atoms towards a substrate takes place.

The lamination of a protective layer to the heat-mode recording layer proceeds e.g. by means of a pressure-sensitive or heat-sensitive adhesive resin layer. One or both of the protective and adhesive layers may be transparent or opaque taking into account the exposure procedure applied in the heat-mode recording and the reading or copying facilities chosen.

The adhesive layer has preferably a thickness in the range of 0.1 to 15 $\mu$m, more preferably has a thickness in the range of 1 to 5 $\mu$m.

This invention is illustrated by way of example by accompanying drawings in which:

FIG. 1 represents a cross-sectional view of a vacuum-deposition apparatus including a lamination unit for carrying out the process according to the present invention.

Figure 2:
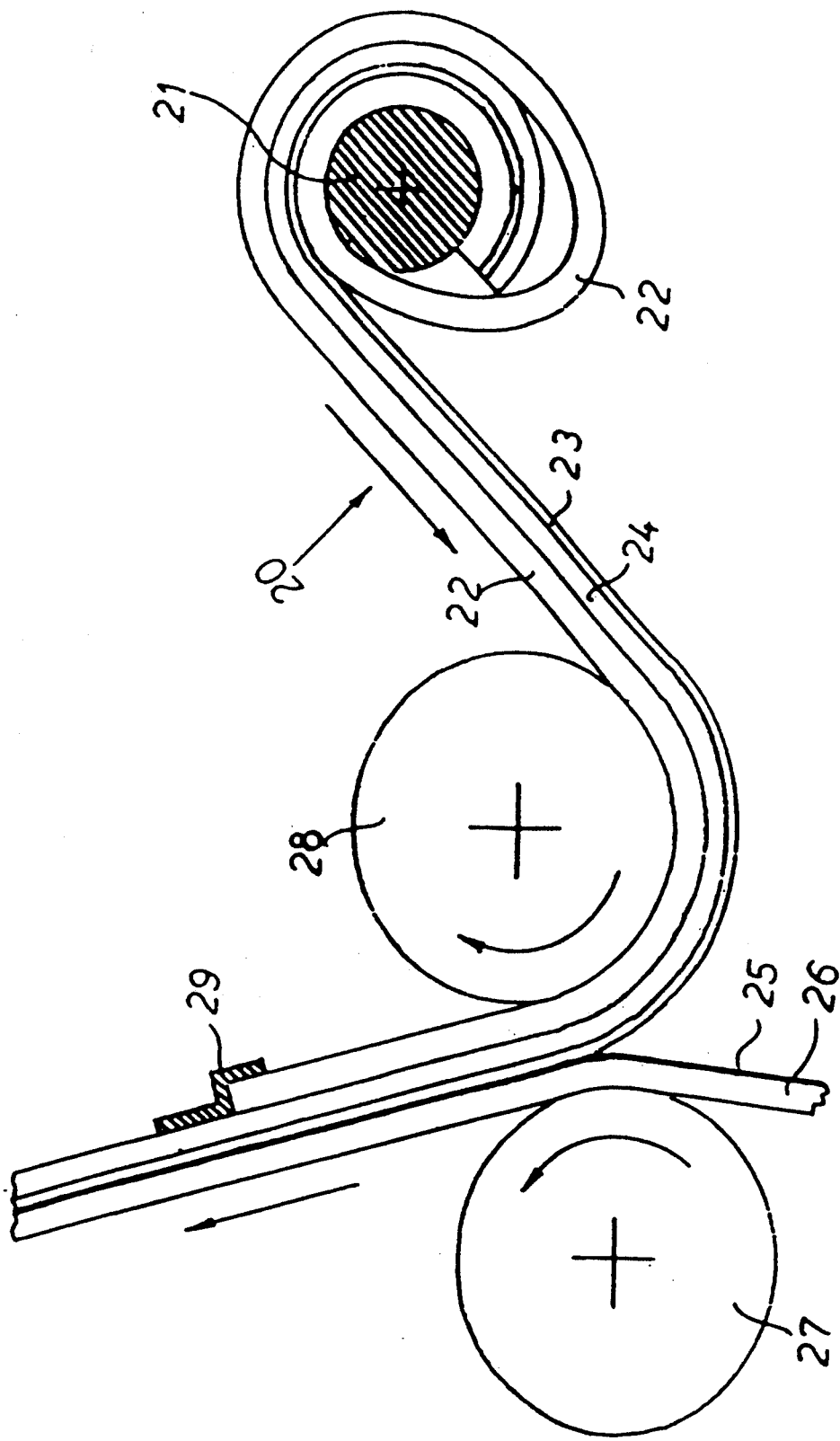
Figure 3:
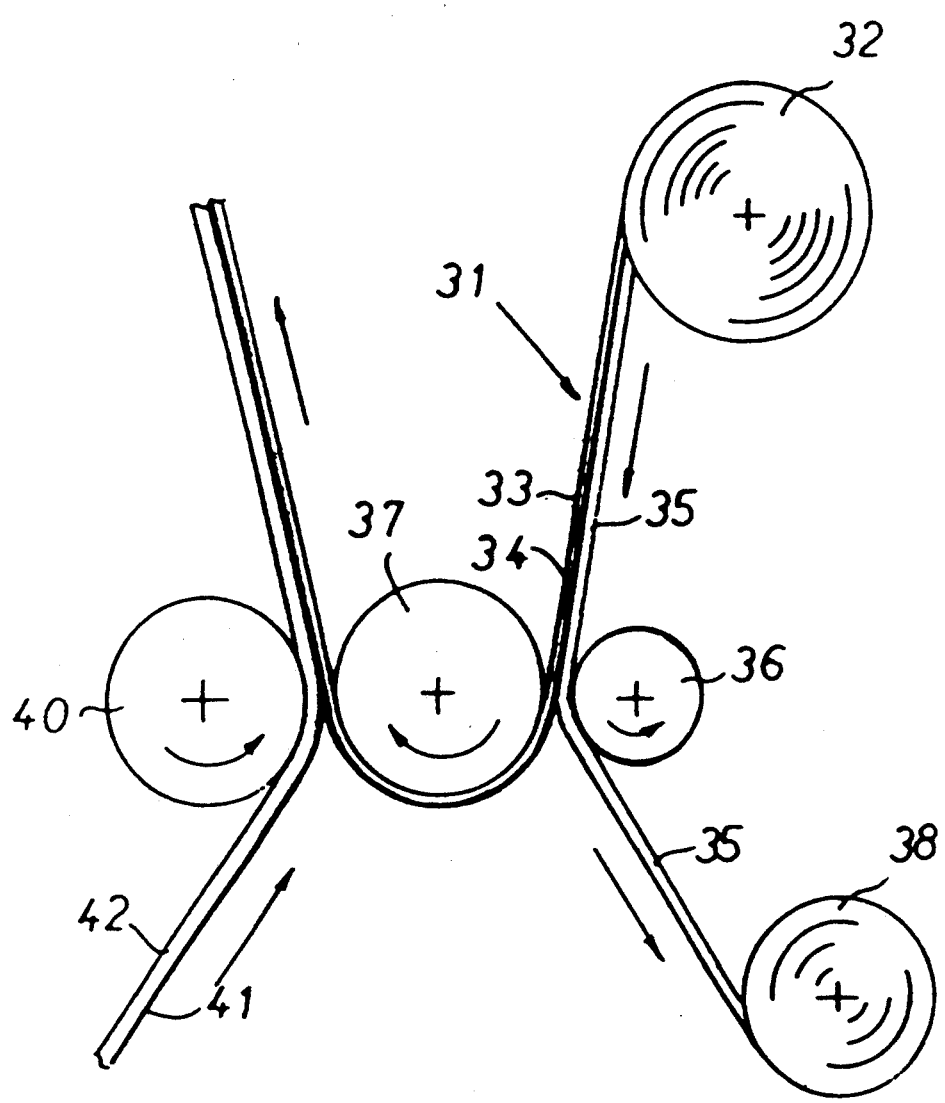

FIGS. 2 and 3 each represent in detail cross-sectional views of different embodiments for applying a protective layer by lamination under vacuum conditions onto a heat-mode recording web material.

Referring to FIG. 1 a cylindrical vacuum chamber 1 contains an electrically heated refractory tray or boat 2 in which a relatively low melting metal, e.g. bismuth, 3 is present as metal vapour source. Under high vacuum (e.g. at a pressure in the range of $10^{-2}$ Pa to $8 \times 10^{-1}$ Pa) the obtained metal vapour is directed towards a web 4 made of polyethylene terephthalate and is deposited thereon at a thickness in the range of 5 nm to 300 nm. The web 4 is supplied by an unwinding roll 5 and is conveyed over a guiding roller 7 against a cooled support roller 6. A baffle 8 restricts the vapour deposition on the web 4 to a small sector of the cooling roller 6. In that way unwanted deposition of metal e.g. on the wall of the vacuum chamber is prevented. After passing the zone of the metal vapour deposition the web 4 travels upwardly to meet a laminating web 9 in the nip formed between a pressure roller 10 exerting pressure towards a backing roller 11. From unwinding roll 13 the laminating web 9 is conveyed into said nip. The laminating web 9 comprises a soft pressure sensitive transparent adhesive layer between a hard protective resin layer and a temporary support. In said nip the adhesive layer having on top the hard protective layer becomes stuck to the freshly vapour deposited metal layer whereupon the formed laminate 14 is wound on a winding roll 12 that serves as storage and supply roll for the manufactured heat-mode recording material.

The cutting of the web material into micro-film formats or optical floppy disks takes place out of the vacuum chamber.

In the embodiment illustrated by FIG. 2 for clarity's sake some dimensions and proportions have been exaggerated. In said embodiment a multilayer laminating web 20 is supplied for laminating purposes from an unwinding roll 21. A peelable relatively thick web resin support 22 serving as temporary support, optionally properly subbed, e.g. siliconised, for easy peel-off, forms temporarily a backing for a thin transparent pressure-sensitive adhesive layer 23 that adheres to an optionally properly subbed transparent permanent resin support 24. Said permanent support being e.g. a polyethylene terephthalate support subbed to improve its adherence to the adhesive layer, has e.g. a thickness in the range of 2 to 200 $\mu$m.

The lamination procedure is started by peeling apart the temporary support 22 from the adhesive resin layer 23 and by turning the peeled off temporary support 22 over 360° along the curvature of the unwinding roller 21 to bring it on top of the permanent support 24 as shown in the drawing. The lamination proceeds as explained in connection with FIG. 1 by pressure applied to the web element 20 in contact with the heat-mode recording layer 25 which is present on a web support 26. The support 26 has e.g. a thickness in the range of 2 to 200 $\mu$m. The pressure is applied in the nip between a pressure roller 27 and a backing roller 28. The temporary support 22 and the permanent support 24 of the laminating web are fixed to each other temporarily at the leading end (starting end) by means of a fixing tape 29.

Out of the vacuum environment after the lamination took place said both supports of the laminating web are separated and the support 22 is wound on a separate take-up roll not shown in the drawing.

In the embodiment illustrated by FIG. 3 a multilayer laminating web 31 is supplied for laminating purposes from an unwinding roll 32. The multilayer laminating web 31 consists of a web resin support 33 serving later on as protective covering layer, a pressure-sensitive adhesive layer 34 and a web resin support 35 that is peeled off the adhesive layer 34 after leaving the nip formed between the guiding roller 36 and the pressure roller 37. The peeled-off temporary support 35 is wound on a take-up roll 38 in the same environment wherein the vacuum deposition of the heat-mode recording layer takes place.

After said peeling-off the adhesive layer 34 carried by the permanent web resin support 33 is pressed in the nip of a tensioned pressure roller 40 and the pressure roller 37 into contact with a heat-mode recording layer 41 being vacuum-deposited onto a transparent web resin support 42.

According to a preferred embodiment for effecting the lamination of a heat-mode recording layer applied by vacuum-deposition onto a relatively thick (50 to 200 $\mu$m) web support a laminating web is used which consists of a peelable web resin support having a thickness in the range of 20 to 200 μm serving temporarily as a backing for a transparent adhesive layer that adheres to a transparent permanent resin support, e.g. polyethylene terephthalate support, serving later on as protective layer and being thinner than 20 μm, e.g. having a thickness in the range of 2 to 15 μm.

A recording material produced by said embodiment is suited for the production of copies by contact exposure wherein in the exposure the recording layer of the copy material, e.g. a silver halide emulsion layer, is kept in close contact with the laminated thin transparent protective layer of the imaged heat-mode recording material.

According to another embodiment the heat-mode recording layer itself is deposited on a very thin transparent resin web support, e.g. polyethylene terephthalate support, having a thickness in the range of 2 to 20 μm and a transparent or opaque covering resin layer having a thickness in the range of 50 to 200 μm is adhered by adhesive layer to the heat-mode recording layer in the lamination process according to the present invention.

In the production of a heat-mode recording material having direct-read-after write capabilities bismuth has interesting properties. Vacuum-deposited bismuth yields a high optical density even in very thin (thickness smaller than 200 nm) layers. The optical density of such vapour-deposited bismuth layer can be reduced by flash light or laser beam exposure and bismuth adheres directly to an unsubbed polyethylene terephthalate support as has been mentioned already in GB-P 1,566,802.

The application of a thin bismuth film for DRAW recording is described in the journal Optica Acta, 1977, vol. 24, No. 4, 427–431. The storage layer, i.e. the recording layer, described therein consists of a 60 nm bismuth layer and a Ge anti-reflex coating that prevents to a certain degree oxidation of the bismuth layer.

In the application of the process according to the present invention preference is given to the use of a multilayer laminating web providing to the laminate an outermost protective element made of a hard highly scratch resistant resin. Examples of such resins are: polyester resins such as polyethylene terephthalate, polycarbonates, polyamides, styrene and (meth)acrylate polymers and copolymers.

For the adherence of the hard protective outermost resin layer to the heat-mode recording layer preferably a layer of a pressure-sensitive adhesive resin is used. Examples of such resins are described in U.S. Pat. No. 4,033,770 for use in the production of adhesive transfers (decalcomanias) by the silver complex diffusion transfer process, in the Canadian Patent 728,607 and in the U.S. Pat. No. 3,131,106.

Pressure-sensitive adhesives are usually composed of (a) thermoplastic polymer(s) having some elasticity and tackiness at room temperature (about 20° C.), which is controlled optionally with a plasticizer and/or tackifying resin. A thermoplastic polymer is completely plastic if there is no recovery on removal of stress and completely elastic if recovery is instantaneous and complete.

Particularly suitable pressure-sensitive adhesives are selected from the group of polyterpene resins, low density polyethylene, a copoly(ethylene/vinyl acetate), a poly(C1–C16)alkyl acrylate, a mixture of poly(C1–C16)alkyl acrylate with polyvinyl acetate, and copoly(vinyl acetate/acrylate) being tacky at 20° C.

In the production of a pressure-adhesive layer an intrinsically non-tacky polymer may be tackified by the adding of a tackifying substance, e.g. plasticizer or other tackifying resin.

Examples of suitable tackifying resins are the terpene tackifying resins described in the periodical "Adhesives Age", Vol. 31, No. 12, November 1988, p. 28–29.

According to another embodiment the protective layer is laminated or adhered to the heat-mode recording layer by means of a heat-sensitive also called heat-activatable adhesive layer, examples of which are described also in U.S. Pat. No. 4,033,770. In such embodiment the laminating material consisting of adhesive layer and abrasion resistant protective layer and/or the recording web material to be protected by lamination are heated in their contacting area to a temperature beyond the softening point of the adhesive. Heat may be supplied by electrical energy to at least one of the rollers between which the laminate is formed or it may be supplied by means of infra-red radiation. The laminating may proceed likewise by heat generated by high-frequency micro-waves applied between a platen and pressure exerting means as described e.g. in published EP-A 0 278 818 directed to a method for applying a plastic covering layer to documents.

A survey of pressure and/or heat-sensitive adhesives is given by J. Shields in "Adhesives Handbook", 3rd. ed. (1984), Butterworths-London, Boston, and by Ernest W. Flick in "Handbook of Adhesive Raw Materials" (1982), Noyens Publications, Park Ridge, New Jersey-U.S.A.

The adhesive layer may be heat-curable or ultra-violet (UV) radiation curable. For heat-curable organic resins and curing agents therefor reference is made e.g. to the above mentioned "Handbook of Adhesive Raw Materials", and for UV curable resin layers reference is made e.g. to "UV Curing: Science and Technology"-Technology Marketing Corporation, 642 Westover Road-Stanford-Conn.-U.S.A.-06902 (1979).

However, in heat-mode recording with an ablatable or meltable metal layer preference is given to an easily deformable adhesive layer so that it does not form a hindrance for the formation of small metal globules in the areas of the recording layer struck by high intensity light energy, e.g. flash lamp or laser energy. The easy deformability of the adhesive interlayer is in favour of recording sensitivity.

For information written by heat-mode recording and to be read out in the transmission mode and for projection purposes, e.g. for COM reproduction in the form of enlarged copies in a reader-printer, the recording layer is vacuum-deposited onto a transparent resin support. Representative resin supports are made of hard polymers, e.g. polyesters such as polyethylene terephthalate, polycarbonates, cellulose triacetate, poly(meth)acrylic esters, polyvinyl chloride and copolymers. These supports have e.g. a thickness in the range of 5 to 200 μm and are optionally provided with one or more subbing layers improving the adherence of the recording layer and/or are provided with a soft thermally deformable layer, e.g. a polyolefin layer such as polyethylene layer having a thickness smaller than 10 μm.

In order to obtain recording materials that are suited for the production of images that wholly or partly can be read-out in the reflection mode the defined recording layer, e.g. an organic dye layer, is applied on a reflective support or supported reflective interlayer, e.g. made of aluminum or containing a dispersion of white pigment, e.g. titanium dioxide in a hydrophilic waterpermeable binder, e.g. gelatin.

According to a special embodiment for improving the heat-mode recording sensitivity the recording layer is applied on a thermally decomposable layer carried by a heat-insulating resin support. The thermally decomposable layer contains preferably nitrocellulose and may contain dissolved dyes that absorb the light used in the recording. A nitrocellulose layer containing dyes suited for laser beam recording is described e.g. in U.S. Pat. No. 4,158,715.

According to a modified embodiment the thermally decomposable layer contains nitrocellulose mixed with gelatin as thermally deformable substance.

According to a further embodiment the recording layer is present on an underlying layer containing a blowing agent and/or such blowing agent is present in the pressure-sensitive adhesive layer of the laminate produced according to the present invention. A blowing agent is a substance that decomposes and yields gaseous products by heating above 50° C. Such substsances are e.g. carbonates such as ammonium hydrogen carbonate, sodium carbonate and ethylene carbonate and sulphonylhydrazides. Further are mentioned urea, oximes such as 1,3,5-cyclohexanetrione trioxime and the photosensitive 0-acyl oximes described in U.S. Pat. No. 3,558,309.

We claim:

1. In a process for the production of a heat-mode recording material having "direct read after write" (DRAW) capabilities wherein a web support is coated within a sealed zone maintained under vacuum conditions with a heat-mode recording layer, the improvement of laminating a protective organic resin layer in web form onto said supported recording layer by means of an adhesive layer while said supported recording layer remains within said sealed zone and while maintaining said vacuum conditions.

2. The method of claim 1, wherein said web support is unwound from a delivery reel and collected onto a take-up reel both contained within said sealed zone and said recording layer is coated onto said web support in a region intermediate said reels and which further comprises laminating said protective resin layer onto said recording layer after the same is coated onto said web support but before the coated web support is collected onto said reel.

3. A process according to claim 1, wherein the lamination of a protective layer to the heat-mode recording layer proceeds by means of a transparent or opaque pressure-sensitive or heat-sensitive adhesive resin layer.

4. A process according to claim 1, wherein said adhesive resin layer is heat-curable or UV-curable.

5. A process according to claim 1, wherein the adhesive layer has a thickness in the range of 0.1 to 15 μm.

6. A process according to claim 1, wherein said protective layer comprises a hard protective resin layer covered with a transparent adhesive resin layer.

7. A process according to claim 1, wherein said protective organic resin layer has a thickness in the range of 2 to 200 μm.

8. A process according to claim 1, wherein the heat-mode recording layer is deposited on a transparent web resin support having a thickness in the range of 50 to 200 μm and a transparent protective resin layer having a thickness in the range of 2 to 15 μm is laminated by said adhesive layer onto the heat-mode recording layer.

9. A process according to claim 1, wherein the heat-mode recording layer is coated on a transparent web resin support having a thickness in the range of 2 to 20 μm and a transparent or opaque protective resin layer having a thickness in the range of 50 to 200 μm is laminated by said adhesive layer to the heat-mode recording layer.

10. A process according to claim 1, wherein the heat-mode recording layer is a vacuum-deposited bismuth layer.

11. A process according to claim 1, wherein the adhesive layer is a pressure-sensitive adhesive layer containing at least one adhesive selected from the group of a polyterpene resin, low density polyethylene, a copoly(ethylene/vinyl acetate), a poly(C1-C16)alkyl acrylate, a mixture of poly(C1-C16)alkyl acrylate with polyvinyl acetate, and a copoly(vinyl acetate/acrylate) being tacky at 20° C.

12. A process according to claim 1, wherein said protective layer is made of a resin selected from the group consisting of a polyester, a polycarbonate, a polyamide, a styrene polymer or copolymer and a (meth)acrylate polymer or copolymer.

13. A process according to claim 1, wherein said protective organic resin layer is applied from a laminating web comprising a peelable temporary resin support having a thickness in the range of 20 to 200 μm and serving temporarily as a backing for said adhesive layer and adhered to said adhesive layer a transparent permanent resin support serving as said protective organic resin layer.

14. A process according to claim 13, wherein said laminating web is unwound from an unwinding roller before undergoing the lamination and said temporary support is peeled apart from the adhesive resin layer and is turned over 360° along the curvature of its unwinding roller and affixed on top of said permanent resin support to be carried along with the latter to effect peeling separation of the temporary support during unwinding.

15. A process according to claim 14, wherein after completion of the lamination the laminated material is removed from the sealed zone whereupon both said temporary and permanent supports are separated and said temporary support is wound on a take-up roll.

* * * * *